United States Patent
Sera

[19]

[11] Patent Number: 6,146,977
[45] Date of Patent: *Nov. 14, 2000

[54] METHOD OF MANUFACTURING A RADIATION-RESISTANT SEMICONDUCTOR INTEGRATED CIRCUIT

[75] Inventor: Yoshiaki Sera, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/709,151

[22] Filed: Sep. 6, 1996

[30] Foreign Application Priority Data

Sep. 8, 1995 [JP] Japan .................................. 7-231715

[51] Int. Cl.$^7$ .................................................. H01L 21/762
[52] U.S. Cl. ............................................................ 438/450
[58] Field of Search .................................. 438/450, 451, 438/527, FOR 229

[56] References Cited

U.S. PATENT DOCUMENTS

| | | |
|---|---|---|
| 4,261,761 | 4/1981 | Sato et al. . |
| 4,987,093 | 1/1991 | Teng et al. . |
| 5,240,874 | 8/1993 | Roberts . |
| 5,384,279 | 1/1995 | Stolmeijer et al. . |
| 5,468,677 | 11/1995 | Jun . |
| 5,556,798 | 9/1996 | Hong . |
| 5,623,154 | 4/1997 | Murakami et al. . |
| 5,635,413 | 6/1997 | Mitsunaga et al. . |
| 5,661,045 | 8/1997 | Manning et al. . |

FOREIGN PATENT DOCUMENTS

| | | |
|---|---|---|
| 61-226967 | 10/1986 | Japan . |
| 5-25204 | 3/1993 | Japan . |
| 125180 | 5/1996 | Japan . |

*Primary Examiner*—George Fourson
*Attorney, Agent, or Firm*—Sughrue, Mion, Zinn, Macpeak & Seas, PLLC

[57] ABSTRACT

A method for fabricating a semiconductor integrated circuit having MOS (Metal-Oxide-Semiconductor) transistors which do not produce increased leakage currents upon exposure to radiation and which are free of lateral diffusion of impurities from channel stopper layers. The method comprises the steps of (a) applying ions of an impurity of one conductivity type with a relatively high energy toward a central region of a field oxide film formed as a isolating region in a semiconductor substrate of the same conductivity type as the one conductivity type; and (b) applying ions of the impurity with a relatively low energy toward at least a peripheral region of the field oxide film.

5 Claims, 4 Drawing Sheets

METHOD OF MANUFACTURING A RADIATION-RESISTANT SEMICONDUCTOR INTEGRATED CIRCUIT

BACKGROUND OF THE INVENTION

1. Field of the Invention

The present invention relates to a method of manufacturing a semiconductor integrated circuit having MIS (Metal-Insulator-Semiconductor) devices, and more particularly to a method of forming a channel stopper layer for the fabrication of a highly radiation-resistant semiconductor integrated circuit.

2. Description of the Prior Art

For isolating MIS devices such as MOS (Metal-Oxide-Semiconductor) transistors from each other on a substrate in a process of fabricating silicon semiconductor integrated circuits, it has generally been customary to form a thick field oxide film in a device separating region according to a LOCOS (Local Oxidation of Silicon) process. In manufacturing integrated circuits including n-channel MOS transistors, for reliable device isolation, a channel stopper layer may be formed by ion-implantation or diffusion of a p-type impurity, which is of the same conductivity type as a semiconductor substrate, underneath a field oxide film.

In integrated circuits for use in radiation environments such as outer space, a leakage current flowing between devices or the source and drain of an n-channel MOS transistor increases due to an accumulation of fixed charges caused in a field oxide film or due to an increase in the interfacial level at an interface between a field oxide film and a silicon substrate by the application of a radiation. Therefore, those integrated circuits for use in radiation environments are required to incorporate a channel stopper layer underneath the field oxide film in order to suppress the leakage current.

FIGS. 1, 2, and 3 are illustrative of a conventional process of manufacturing a semiconductor device having a channel stopper layer.

First, as shown in FIG. 1, a field oxide film 202 for device isolation is formed in a p-type silicon semiconductor substrate 201 by a LOCOS process, and a resist film 203 is coated on the entire surface of the semiconductor substrate 201 including the field oxide film 202. Then, a window 204 is defined in the resist film 203 by photolithography. As well known in the art, the field oxide film 202 includes a central thicker portion and a peripheral thin region known as a bird's beak. The window 204 is positioned over the central thicker portion of the field oxide film 202, so that the surface of the central thicker portion of the field oxide film 202 is exposed at the bottom of the window 204. Using the resist film 203 as a mask, ions of boron (B$^+$) are introduced through the window 204 by way of ion implantation at a dosage of $10^{14}$/cm$^2$ with an acceleration energy ranging from 100 to 180 keV, for example. Thereafter, the assembly is annealed at 800° C. for 30 minutes, for example, thereby to activate the introduced boron. As a result, as shown in FIG. 2, a channel stopper layer 205 which contacts with the field oxide film 202 is formed in the p-type semiconductor substrate 201 at a region underneath the central portion of the field oxide film 202.

Since the boron ions are applied to only the central portion of the field oxide film 202, a region 209 free of any channel stopper layer is created underneath the peripheral thin region or the bird's beak of the field oxide film 202. FIG. 3 is a plan view of the assembly shown in FIG. 2, which is a cross-sectional view taken along line II—II' of FIG. 3. If n-channel MOS transistors formed on the p-type semiconductor substrate 201 are isolated from each other by the field oxide film 202, then when radiation is applied to an integrated circuit of the above cross-sectional structure, a leakage current flowing between devices or the source and drain of a MOS transistor through the region 209 free of any channel stopper layer increases due to an accumulation of fixed charges caused in the field oxide film 202 or due to an increase in the interfacial level at an interface between the field oxide film 202 and the silicon substrate 201.

In the example shown in FIGS. 1 through 3, the ions of boron are applied to only the central portion of the field oxide film 202. However, it is possible to apply ions of boron to the entire area of a field oxide film by way of ion implantation.

FIGS. 4 through 6 illustrate a conventional process of manufacturing a semiconductor integrated circuit by applying ions of boron to the entire area of a field oxide film by way of ion implantation.

First, as shown in FIG. 4, a field oxide film 302 is formed in a p-type silicon semiconductor substrate 301 by a LOCOS process, and a resist film 303 is coated on the entire surface of the semiconductor substrate 301. Then, a window 304 is defined in the resist film 303 by photolithography such that the entire surface of the field oxide film 302 is exposed through the window 304. Ions of boron (B$^+$) are introduced through the window 304 by way of ion implantation at a dosage of $10^{14}$/cm$^2$ or lower with an acceleration energy ranging from 100 to 180 keV, for example. Thereafter, the assembly is annealed to activate the introduced boron. As a result, as shown in FIG. 5, a channel stopper layer 305 is formed in the semiconductor substrate 301.

Inasmuch as the boron ions are applied to substantially the entire area of the field oxide film 302 under a high energy condition in the range from 100 to 180 keV, boron ions are introduced deeply into the p-type silicon substrate 301 at the area of immediately below the thin film or bird's beak in the periphery of the field oxide film 302, creating a region 309 on the lower surface of the periphery of the field oxide film 302 out of contact with the channel stopper layer 305. FIG. 6 is a plan view of the assembly shown in FIG. 5, which is a cross-sectional view taken along line V—V' of FIG. 6. When radiation is applied to an integrated circuit of the above cross-sectional structure, a leakage current flowing between devices or the source and drain of a MOS transistor through the region 309 on the lower surface of the field oxide film 302 out of contact with the channel stopper layer 305 increases due to an accumulation of fixed charges caused in the field oxide film 302 or due to an increase in the interfacial level at an interface between the field oxide film 302 and the silicon substrate 301.

According to a process disclosed in Japanese laid-open patent publication No. Sho-61-226967 (JP, A, 61-226967), before a field oxide film is formed, ions are applied at two stages to an area where the field oxide film will be formed, by way of ion implantation, forming a higher-density impurity region and a lower-density impurity region, and thereafter a field oxide film is formed thereby to provide a higher-density channel stopper layer and low-density channel stopper layer beneath the filed oxide film for thereby reducing any leakage current of an n-channel MOS transistor and minimizing any parasitic capacitance. The same level of ion acceleration energy (40 kev) is used for the higher-density impurity region and the lower-density impurity region. The disclosed process makes it possible to reduce the concentration of an impurity in the channel stopper layer at a boundary near a device forming region. However, the disclosed process is problematic in that it fails to assemble devices in a highly integrated fashion because the impurity is diffused laterally from the channel stopper layer in a subsequent step of forming a field oxide film.

Japanese laid-open patent publication No. Hei-5-555204 (JP, A, 5-55204) discloses a technique of suppressing the diffusion of an impurity from a channel stopper layer into a device forming region and preventing a junction breakdown voltage from being lowered, by etching back a field oxide film to a position corresponding to a substrate surface and thereafter forming the channel stopper layer by way of ion implantation. According to such a structure, however, the lower surface of the field oxide film and the channel stopper layer are not held in contact with each other at the bird's beak of-the field oxide film, so that a leakage current will be increased upon exposure to radiation, as with the arrangement described above with reference to FIGS. 4 through 6.

According to the conventional process of manufacturing a semiconductor integrated circuit by forming a channel stopper layer by way of the ion implantation or diffusion of an impurity prior to the formation of a field oxide film, since the impurity is laterally diffused when the field oxide film is formed, it is necessary to increase the distances between devices on the substrate, resulting in an increased integrated circuit chip area.

According to the process of introducing an impurity by way of ion implantation after a field oxide film is formed, it is necessary to increase ion acceleration energy because the ions have to be introduced through the field oxide film. If the ion acceleration energy is increased, then it tends to damage the crystal of the semiconductor substrate. Therefore, it has been customary to effect only one cycle of ion implantation. Accordingly, the lower surface of the periphery of the field oxide film is held out of contact with the channel stopper layer. When an integrated circuit thus manufactured is exposed to radiation, there is developed a region where an interfacial level is created at the interface between the field oxide film and the semiconductor substrate, with the result that a leakage current flowing between devices or the source and drain of an n-channel MOS transistor increases.

SUMMARY OF THE INVENTION

It is an object of the present invention to provide a method of manufacturing a semiconductor integrated circuit which does not produce an increased leakage current upon exposure to radiation and which is free of lateral diffusion of an impurity from a channel stopper layer and hence can be of a high degree of integration.

According to the present invention, the above object can be achieved by a method of manufacturing a semiconductor integrated circuit, comprising the steps of applying ions of an impurity of one conductivity type with a relatively high energy toward a central region of a field oxide film formed as an isolating region in a semiconductor substrate of the same conductivity type as the one conductivity type, and applying ions of the impurity with a relatively low energy toward at least a peripheral region of the field oxide film.

In the step of applying ions of the impurity with a relatively low energy, the ions of the impurity may be applied to an entire surface of the fixed oxide film, so that the ions of the impurity are applied to the peripheral region of the field oxide film. A heat-treatment of the semiconductor substrate is preferable to activate the impurity to form a channel stopper layer in the semiconductor substrate.

The semiconductor substrate may preferably comprise a silicon substrate. If the semiconductor substrate comprises a p-type silicon substrate, then the impurity is boron, for example.

If the semiconductor substrate comprises a silicon substrate, then the semiconductor integrated circuit may be manufactured typically by the following steps: a first step of forming a field oxide film in a predetermined pattern on a silicon substrate; a second step of forming a first resist film on a surface of the silicon substrate including the field oxide film, opening a window in the first resist film in alignment with a central region of the field oxide film, and applying ions of an impurity having the same conductivity type as the silicon substrate with a relatively high energy using the first resist film as a mask thereby to introduce the ions of impurity into the silicon substrate below the central region of the field oxide film; and a third step of removing the first resist film, forming a second resist film on the surface of the silicon substrate including the field oxide film, opening a window in the second resist film in alignment with an entire region of the field oxide film, and applying ions of the impurity having the same conductivity type as the silicon substrate with a relatively low energy using the second resist film as a mask thereby to introduce the ions of impurity into the silicon substrate below a peripheral region of the field oxide film.

Alternatively, the semiconductor integrated circuit may be manufactured by, in the second step, opening a window in the first resist film in alignment with the entire region of the field oxide film and applying ions of the impurity with a relatively low energy thereby introducing the ions into the silicon substrate below the peripheral region of the field oxide film, and by, in the third step, opening a window in the second resist film in alignment with the central region of the field oxide film and applying ions of the impurity with a relatively high energy thereby introducing the ions into the silicon substrate below the central region of the field oxide film.

With the above arrangement, for forming a channel stopper layer in the semiconductor substrate by introducing ions of an impurity having the same conductivity type as the semiconductor substrate into the semiconductor substrate directly below the field oxide film, the ions are introduced in two cycles. In one of the cycles, the ions are applied to the central region of the field oxide film with a relatively high energy, and, in the other cycle, the ions are applied to at least the peripheral region of the field oxide film at relatively low energy. In this manner, the channel stopper layer is formed in an entire region immediately underneath the field oxide film. Even when the semiconductor integrated circuit thus manufactured is exposed to radiation, an interfacial level is prevented from being generated in the field oxide film, and a leakage current between the source and drain of an MIS transistor and a leakage current between devices are suppressed. Since the ions are introduced by way of ion implantation after the field oxide film is formed, no impurity is laterally diffused from the channel stopper layer upon formation of the field oxide film. Therefore, it is possible to construct the semiconductor integrated circuit with a high degree of integration.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

A method of manufacturing a semiconductor device according to the present invention is illustrated in FIGS. 7, 8, 9, and 10.

First, a buffer oxide film is deposited to a thickness ranging from several to several tens nanometers on a surface of a p-type silicon semiconductor substrate 101 (see FIG. 7), and then a silicon nitride film is deposited to a thickness ranging from several tens to several hundreds nanometers on the buffer oxide film. Thereafter a region of the silicon nitride film where a field oxide film is to be formed is removed by wet etching using hot phosphoric acid or by dry etching using $CF_4$ according to photolithography, and then a field oxide film 102 having a thickness ranging from 400 to 700 nm is formed in the removed region by steam oxidization or pressure oxidization. At this time, a thin oxide film known as a so-called bird's beak is created at a boundary between the field oxide film 102 and the silicon nitride film. The silicon nitride film is removed by wet etching using hot phosphoric acid or by dry etching using $CF_4$, and the buffer oxide film is removed by buffer hydrofluoric acid, after which the entire surface formed so far is coated with a resist film 103. Then, a window 104 is formed in the resist film 103 at a position corresponding to a central region of the field oxide film 102 according to photolithography. Using the resist film 103 as a mask, ions of boron ($B^+$) are introduced through the window 104 by way of ion implantation at a dosage of $10^{14}/cm^2$ with an acceleration energy ranging from 100 to 180 keV, for example.

Figure 1:
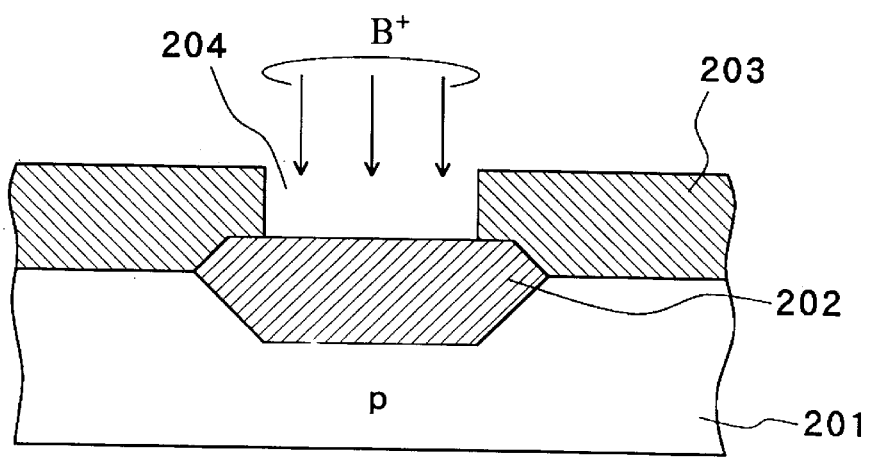
FIG. 1 is a fragmentary cross-sectional view illustrative of a step of a conventional process of manufacturing a semiconductor device.
Figure 2:
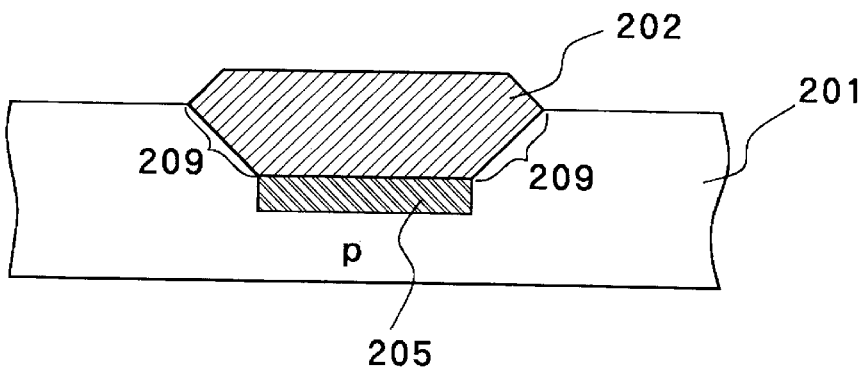
FIG. 2 is a fragmentary cross-sectional view illustrative of a step, following the step shown in FIG. 1, of the conventional process of manufacturing a semiconductor device.
Figure 3:
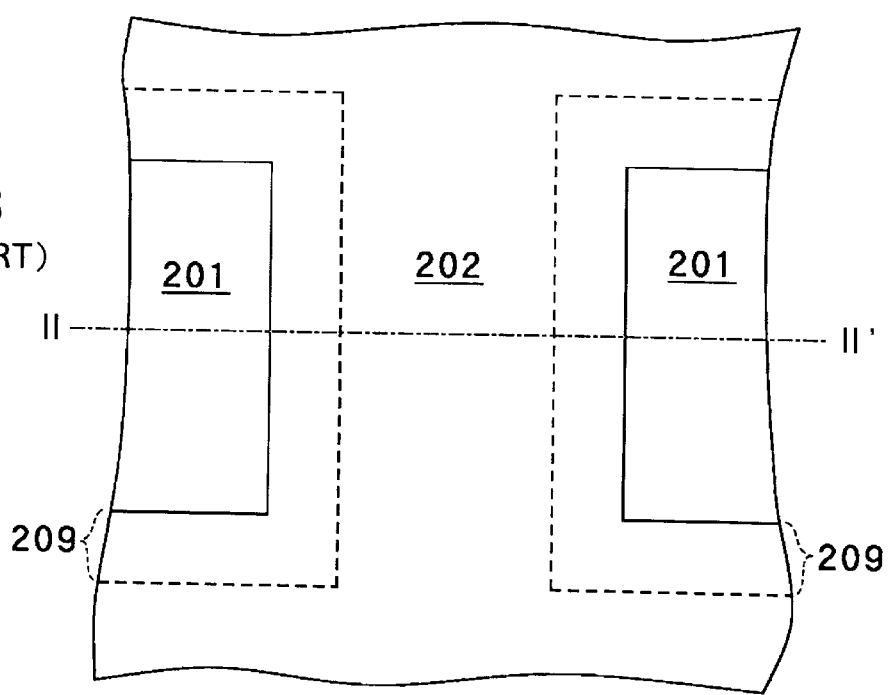
FIG. 3 is a fragmentary plan view of the assembly shown in FIG. 2.
Figure 4:
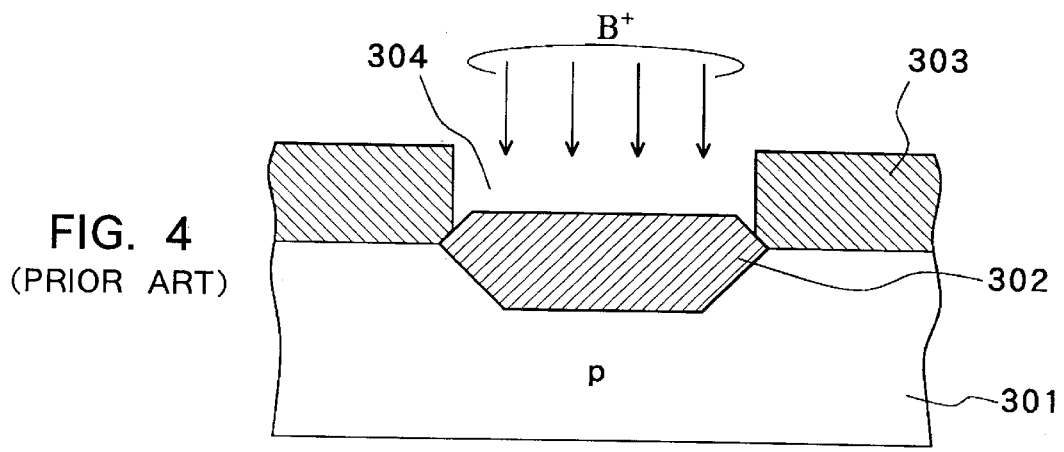
FIG. 4 is a fragmentary cross-sectional view illustrative of a step of another conventional process of manufacturing a semiconductor device.
Figure 5:
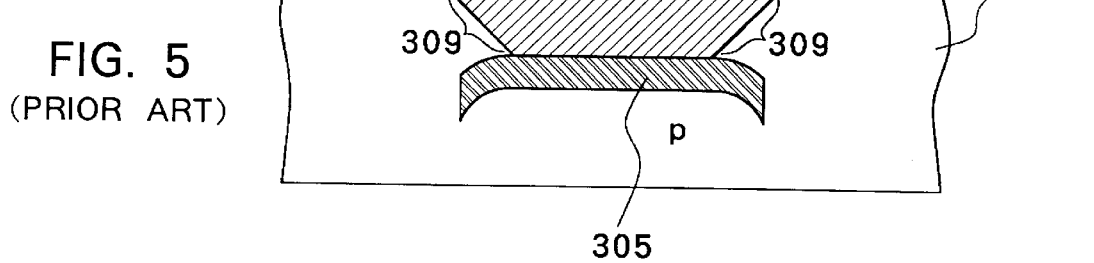
FIG. 5 is a fragmentary cross-sectional view illustrative of a step, following the step shown in FIG. 4, of the other conventional process of manufacturing a semiconductor device.
Figure 6:
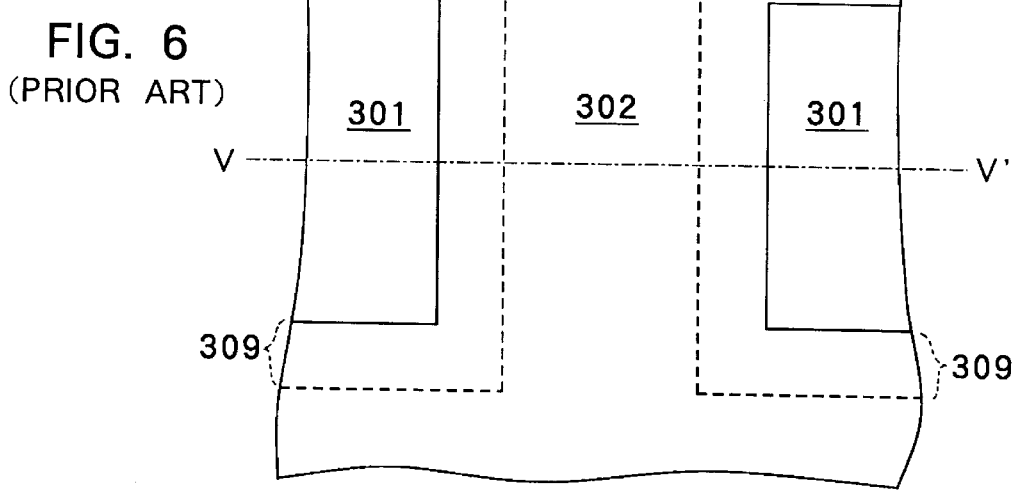
FIG. 6 is a fragmentary plan view of the assembly shown in FIG. 5.
Figure 7:
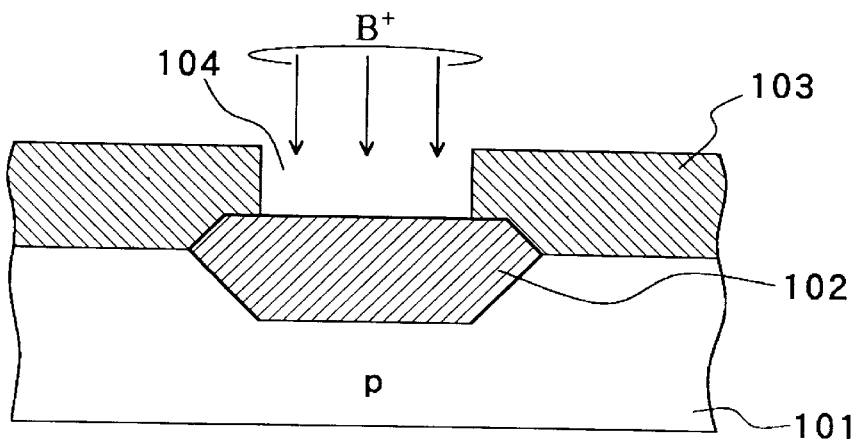
FIG. 7 is a fragmentary cross-sectional view illustrative of a step of a method of manufacturing a semiconductor device according to the present invention.
Figure 8:
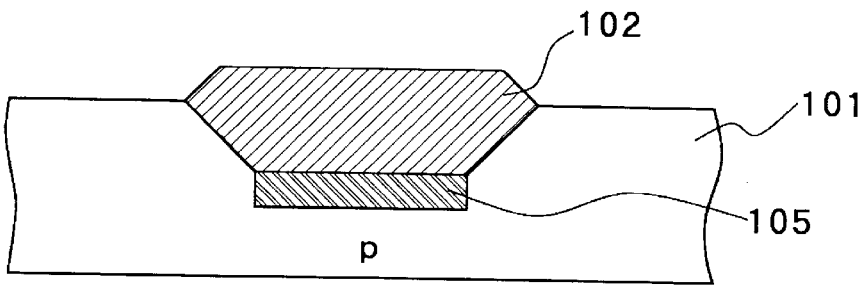
FIG. 8 is a fragmentary cross-sectional view illustrative of a step, following the step shown in FIG. 7, of the method of manufacturing a semiconductor device according to the present invention.

Under the above ion implantation conditions, the boron ions pass through the central region of the field oxide film 102 into a region of the p-type silicon semiconductor substrate 101 which is held in contact with the lower surface of the central region of the field oxide film 102. The resist film 103 is removed, and the assembly is annealed at 800° C. for 30 minutes, for example, thereby to activate the introduced boron. As a result, as shown in FIG. 8, a channel stopper layer 105 is formed in contact with the lower surface of the central region of the field oxide film 102. Generally, the annealing process is performed in a heat treatment process at the time of forming an n-channel MOS transistor.

Figure 9:
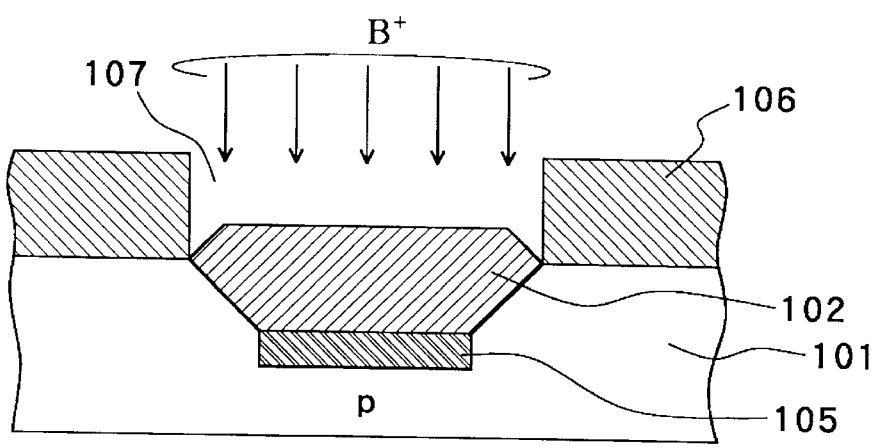
FIG. 9 is a fragmentary cross-sectional view illustrative of a step, following the step shown in FIG. 8, of the method of manufacturing a semiconductor device according to the present invention.

Then, the entire surface formed so far is coated with a resist film 106. A window 107 is formed in the resist film 106 according to photolithography so that the entire upper surface of the field oxide film 102 is exposed through the window 107. Then, as shown in FIG. 9, using the resist film 106 as a mask, ions of boron ($B^+$) are introduced through the window 107 by way of ion implantation at a dosage of $10^{14}/cm^2$ or lower with an acceleration energy smaller than the acceleration energy in the previous ion implantation process, e.g., an acceleration energy ranging from 60 to 120 keV, for example.

Figure 10:
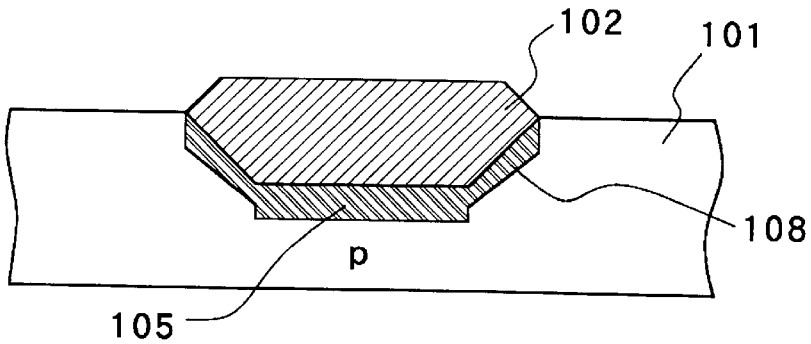
FIG. 10 is a fragmentary cross-sectional view illustrative of a step, following the step shown in FIG. 9, of the method of manufacturing a semiconductor device according to the present invention.
Figure 11:
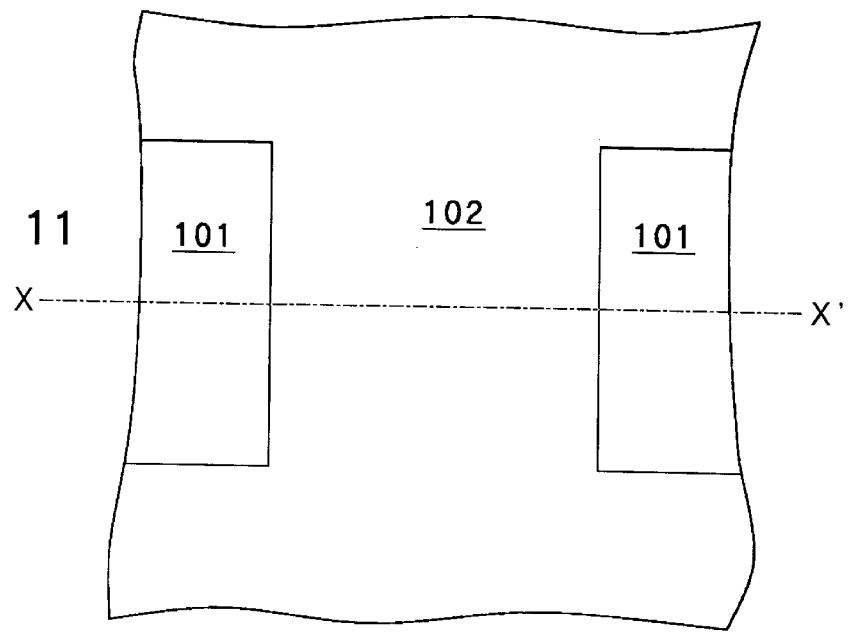
FIG. 11 is a fragmentary plan view of a semiconductor device manufactured by the steps shown in FIGS. 7, 8, 9, and 10.

Under the above ion implantation conditions, the boron ions are unable to pass through the thick central region of the field oxide film 102, but only pass through the peripheral region, i.e., the bird's beak, of the field oxide film 102, into the p-type silicon semiconductor substrate 101. The resist film 106 is then removed, and the assembly is annealed under the same conditions as described above. As shown in FIG. 10, the boron ions introduced into the p-type silicon semiconductor substrate 101 are activated, forming a channel stopper layer 108 in contact with the lower surface of the peripheral region of the field oxide film 102. The channel stopper layer 108 is integrally joined to the channel stopper layer 105 which has been formed underneath the central region of the field oxide film 102. As a consequence, a channel stopper layer is created in the p-type silicon semiconductor substrate 101 in contact with the entire lower surface of the field oxide layer 102. FIG. 11 shows in plan the assembly thus produced, and FIG. 10 is a cross-sectional view taken along line X—X' of FIG. 11.

The annealing process of activating the boron introduced into the p-type silicon semiconductor substrate 101 to form a channel stopper layer will be described below. In this embodiment, the boron ions are introduced in two cycles with different ion acceleration energies. However, the assembly is not required to be annealed after each of the two cycles of ion implantation. The assembly may be annealed after only the second cycle of ion implantation, simultaneously activating the introduced ions of boron into the channel stopper layer 105 held in contact with the lower surface of the central region of the field oxide film 102 and the channel stopper 108 held in contact with the lower surface of the peripheral region of the field oxide film 102. If the method of manufacturing a semiconductor device includes a heating step such as a diffusing step and sufficient heat is applied in such a heating step for activating boron, then it is not necessary to carry out any separate annealing process of activating the introduced boron to form a channel stopper layer.

Figure 12:
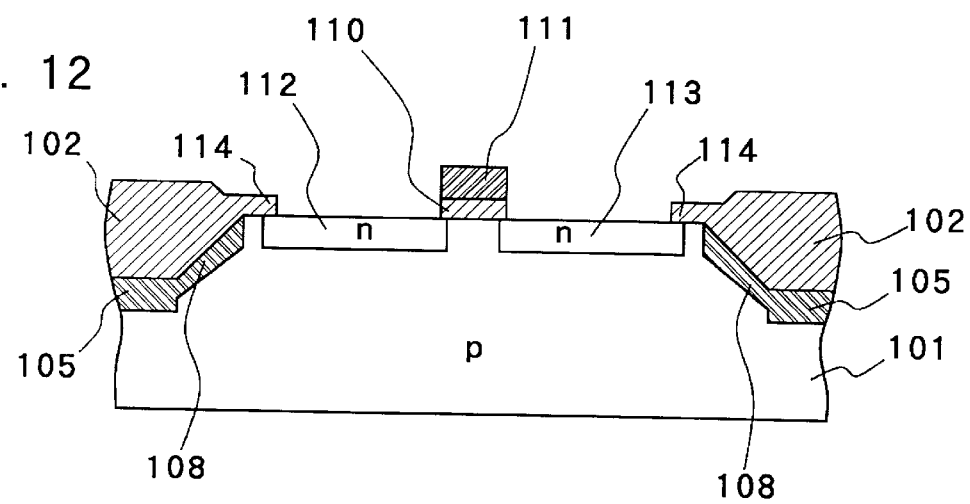
FIG. 12 is a fragmentary cross-sectional view of a MOS transistor which has been manufactured.

A MOS transistor including a silicon semiconductor substrate in which the field oxide film and the channel stopper layer have been formed will be described below. It is assumed that the field oxide film 102 as a device separating region and the channel stopper layers 105, 108 disposed in contact with the field oxide film 102 are formed in the p-type silicon semiconductor substrate 101. FIG. 12 shows an n-channel MOS transistor which is completed using the p-type silicon semiconductor substrate 101.

In the n-channel MOS transistor shown in FIG. 12, a polysilicon gate electrode 111 is formed on a gate oxide film 110 disposed on the p-type silicon semiconductor substrate 101 in a region sandwiched between two field oxide films 102, i.e., in a substantially central region of a device forming region. Regions of the p-type silicon semiconductor substrate 101, disposed one on each side of the polysilicon gate 111, are doped with an n-type impurity, and serve as a source region 112 and a drain region 113.

Since a channel stopper layer is formed in contact with the entire lower surface of each of the field oxide films 102, any leakage current is suppressed upon exposure to radiation in radiation environments such as outer space. When the n-channel MOS transistor is fabricated, thermal oxide films 114 are formed which are joined to the field oxide films 102. Since the thermal oxide films 114 are thin, they do not increase a leakage current even when exposed to radiation. The gate oxide film 110 is also thin, and hence does not increase a leakage current even when exposed to radiation.

A semiconductor integrated circuit with a channel stopper layer formed according to the method of the present invention, and a semiconductor integrated circuit with a channel stopper layer formed according to a conventional process were tested by a radiation exposure test, and their leakage currents were measured. In the radiation exposure test, each of the semiconductor integrated circuits included n-channel MOS transistors, and any leakage current between the source and drain of each of the n-channel MOS transistors was measured.

Gamma radiation with an absorbed dose of $3\times10^3$ Gy(Si) was applied to the semiconductor integrated circuit with the channel stopper layer formed according to the method of the present embodiment. Thereafter, a leakage current between source and drain of each of the n-channel MOS transistors was measured. The measured leakage current was $10^{-14}$ A or less per transistor. Gamma radiation with the same absorbed dose as described above was applied to the semiconductor integrated circuit with the channel stopper layer formed according to the conventional method, i.e., by effecting one cycle of ion implantation on the central region of the field oxide film. A measured leakage current between source and drain of each of the n-channel MOS transistors was $1.5\times10^{-10}$ A per transistor. It can therefore been seen that any leakage current produced upon exposure to radiation was improved four figures or greater by effecting the two cycles of ion implantation after the field oxide film is formed, with boron ions being applied to the central region of the field oxide film with a relatively high energy in one of the cycles, and also with boron ions being applied to the field oxide film including the peripheral region thereof with a relatively low energy in the other cycle.

While the method of the present invention has been described as being applied to the formation of n-channel MOS transistors in a p-type silicon substrate, the principles of the present invention are not limited to the illustrated embodiment. The present invention is also applicable to the formation of p-channel MOS transistors in an n-type semiconductor substrate. In the illustrated embodiment, boron ions are applied to the central region of the field oxide film with a relatively high energy, and then boron ions are applied to substantially the entire surface of the field oxide film with a relatively low energy. However, the application of boron ions with a relatively high energy and the application of boron ions with a relatively low energy may be switched around in order.

Although a certain preferred embodiment of the present invention has been shown and described in detail, it should be understood that various changes and modifications may be made therein without departing from the scope of the appended claims.

What is claimed is:

1. A method of manufacturing a semiconductor integrated circuit, comprising the steps of:

providing a substrate of one conductivity type with a field oxide embedded partially within said substrate and extending partially above said substrate, said field oxide having a central region which is thicker than a peripheral region designated as a bird's beak and wherein said bird's beak is formed such that it tapers in thickness from a thickest portion immediately adjacent to said central region of said field oxide to a thinnest portion at a point on the surface of said substrate;

directing ions of an impurity onto only said central region of said field oxide by using a relatively high first implantation energy, said first implantation energy being sufficient to pass said ions through said central region and into said semiconductor substrate beneath said central region, said impurity being of a conductivity type which is the same as said one conductivity type; and directing ions of said impurity by using a relatively low second implantation energy, lower than said first implantation energy, onto only said field oxide, said second implantation energy being sufficient to pass said ions through said bird's beak and into said semiconductor substrate beneath said bird's beak but said second implantation energy not being sufficient to pass said ions through said central region;

wherein, upon applying ions of said impurity by using said first and second implantation energies, a channel stopper layer is formed in contact with an entire lower surface of said field oxide including said central region and said bird's beak.

2. A method according to claim 1, wherein said semiconductor substrate comprises a p-type silicon substrate, and said impurity comprises boron.

3. A method according to claim 1, further comprising the step of activating said concentration of ions to form a channel stopper layer in said semiconductor substrate which contacts the entire bottom surface of said field oxide.

4. A method of manufacturing a semiconductor integrated circuit, comprising the steps of:

forming a field oxide on a silicon substrate of one conductivity type, said field oxide having a central region which is thicker than a peripheral region designated as a bird's beak and wherein said bird's beak is formed such that it tapers in thickness from a thickest portion immediately adjacent to said central region of said field oxide to a thinnest portion at a point on the surface of said substrate;

forming a first resist film on a surface of said silicon substrate including said field oxide, providing a first window in said first resist film to expose only said central region of said field oxide, and directing ions of an impurity by using a first implantation energy toward said first resist film, such that said ions of said impurity pass through said first window and said central region, and into said silicon substrate below said central region of said field oxide, said impurity being of a conductivity type which is the same as said one conductivity type; and removing said first resist film, forming a second resist film on said surface of said silicon substrate including said field oxide, providing a second window in said second resist film to expose only said central region and said bird's beak of said field oxide, and directing ions of said impurity by using a second implantation energy, lower than said first implantation energy, toward said second resist film, such that said ions of said impurity pass through said second window and said bird's beak, and into said silicon substrate below said bird's beak of said field oxide, said second implantation energy being insufficient to pass said ions of said impurity through said central region of said field oxide.

5. A method according to claim 4, wherein said impurity comprises boron and further comprising the step of activating a concentration of ions of said impurity in said semiconductor substrate to form a channel stopper layer in said silicon substrate which contacts the entire bottom surface of said field oxide.

* * * * *